United States Patent [19]
Achtner et al.

[11] Patent Number: 5,788,769
[45] Date of Patent: Aug. 4, 1998

[54] EVAPORATOR BOAT FOR AN APPARATUS FOR COATING SUBSTRATES

[75] Inventors: Wolfgang Achtner, Maintal; Günter Klemm, Nidda, both of Germany

[73] Assignee: Balzers und Leybold Deutschland Holding AG, Hanau am Main, Germany

[21] Appl. No.: 804,488

[22] Filed: Feb. 21, 1997

[30] Foreign Application Priority Data

Feb. 28, 1996 [DE] Germany ............... 196 07 400.2

[51] Int. Cl.⁶ .................................................. C23C 14/00
[52] U.S. Cl. .................. 118/50; 118/726; 373/118; 392/389
[58] Field of Search .................... 118/50, 500, 726; 373/118; 392/389

[56] References Cited

U.S. PATENT DOCUMENTS

| | | | |
|---|---|---|---|
| 2,615,060 | 10/1952 | Marinace et al. | 373/118 |
| 3,020,177 | 2/1962 | Alexander | 117/107 |
| 3,636,305 | 1/1972 | Passmore | 118/726 |
| 4,036,167 | 7/1977 | Lu | 118/7 |
| 5,179,622 | 1/1993 | Kleyer | 392/389 |
| 5,198,032 | 3/1993 | Kleyer et al. | 118/718 |
| 5,242,500 | 9/1993 | Elvers et al. | 118/718 |
| 5,261,964 | 11/1993 | Grimm | 118/726 |
| 5,495,550 | 2/1996 | Mariner et al. | 118/726 |

FOREIGN PATENT DOCUMENTS 51-119386  10/1976  Japan.

OTHER PUBLICATIONS

J.F. Cosgrove and R.J. Eschbach, "Titanium Evaporation Source". *IBM Technical Disclosure Bulletin*, vol. 27, No. 1A (Jun. 1984).

*Primary Examiner*—Laura Edwards
*Attorney, Agent, or Firm*—Felfe & Lynch

[57] ABSTRACT

A flat, elongate, trough-shaped part (8) made of an electrically conductive ceramic can be heated by the direct passage of current between clamping points at opposite ends. The trough-shaped part (8) being provided with openings (12) for reducing cross sectional area where increased ohmic heating is desired, such as near the clamping points and between individual areas where wire is fed for melting in the trough.

9 Claims, 1 Drawing Sheet

EVAPORATOR BOAT FOR AN APPARATUS FOR COATING SUBSTRATES

BACKGROUND OF THE INVENTION

The invention pertains to an evaporator boat for an apparatus for coating substrates in a vacuum coating chamber, the boat consisting of a flat, trough-shaped part of electrically conductive material, which can be heated by the direct passage of current.

Current-carrying, trough-shaped evaporator boats with rectangular outlines, especially for series evaporators, which are provided with clamping surfaces on their two vertical ends or narrow sides, by means of which they are supported on the boat holders, are known.

U.S. Pat. No. 5,242,500 discloses an apparatus for the continuous coating of strip-shaped substrates in a vacuum coating chamber with a plurality of evaporator boats of approximately the same size and configuration, in which the boats are parallel to each other and approximately equal distances apart in the direction of strip travel to form an evaporator bank. The evaporator boats are also made of electrically conductive ceramic and can be heated by the direct passage of current. The apparatus also has a device which continuously feeds the wire to be evaporated to the evaporator boats. The individual evaporator boats are staggered with respect to each other, and all the evaporator boats together cover a narrow coating zone, which is crosswise to the direction of strip travel.

The staggered arrangement is intended to reduce the interaction between the individual sources and thus to improve the uniformity of the coating. The individual evaporator boats themselves have a rectangular cross section, and the recesses which hold the molten material all have a rectangular outline.

DE 970 246 discloses an older apparatus for the continuous deposition of coatings from the vapor phase on endless strips with several directly heated evaporators arranged in a row. Here an attempt was made to eliminate the disadvantage of the conventional type of evaporator with a rectangular outline for the recess, which arises from the fact that the evaporating material, which is an excellent conductor of electrical current, short-circuits the evaporator to some extent so that only the parts of the evaporator between the individual recesses serve as heat generators, which means than a nonuniform coating is produced. According to this previously published document, this disadvantage is to be eliminated by reducing the cross section of the evaporator between the individual recesses, so that the electrical resistance of the evaporator is approximately constant and independent of the amount of evaporation material filling the chambers.

U.S. Pat. No. 5,179,622 discloses, a series evaporator for vacuum vapor deposition systems, especially systems for the coating of strip material, is described, consisting of several evaporators, which can be controlled individually in terms of the power sent to them and which are heated by the passage of current therethrough. These evaporators rest on bracket-like electrical feed lines; these bracket-like feed lines are held by an electrically conductive support body extending over the entire length of the series evaporator, and the feed lines of one polarity are connected in an electrically conductive manner to the support body, whereas the feed lines of the other polarity pass in an insulated manner through the support body and are connected to insulated lead wires. The evaporators are supported by way of bearing elements preferably designed as sections of a cylinder on the upper ends or tips of the feed lines, for which purpose the bearing elements are made of a current-carrying material such as a ceramic.

This older series evaporator solves the problem of how to clamp the evaporators in pairs between the electric feed lines and how to ensure good electrical contact during the evaporation process. But even with this pairwise arrangement of the evaporators, the problem of obtaining coatings of optimum uniformity is not yet completely solved.

Finally, U.S. Pat. No. 5,261,964 discloses an evaporator boat consisting of a flat, trough-shaped part of electrically conductive material. The boat can be heated by the direct passage of current through it, and it has an essentially rhombic or rhomboidal outline. The configuration of the recess is approximately the same as that of the boat. Two diametrically opposite corners of the evaporator boat are each provided with a flattened, approximately rectangular, vertical area, the two of which together form the parallel clamping surfaces of the evaporator boat.

SUMMARY OF THE INVENTION

According to the invention, optimum coating is achieved by providing the trough-shaped part with openings such as vertical holes longitudinally in front of and/or behind the area wetted by molten material. The reduction in cross sectional area increases ohmic heating in that area, and also reduces heat dissipation.

In the case of a boat with a plurality of zones arranged in a row for the melting of the material to be evaporated, it is advisable to provide the trough-shaped part with openings between the individual zones and also in front of and behind the last zone.

The invention can be embodied in a wide variety of ways; two of them are illustrated in greater detail in the drawing.

DETAILED DESCRIPTION OF THE PREFERRED EMBODIMENT

Figure 1:
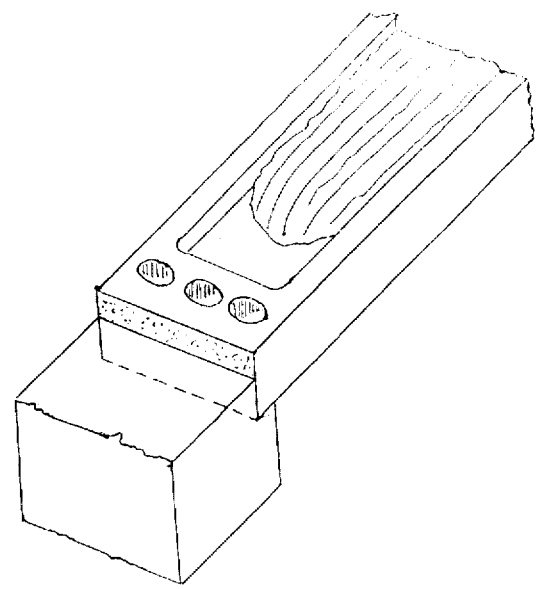
FIG. 1 is partial perspective of a boat with a single evaporation zone, groups of holes being provided near each of the two diametrically opposed clamping surfaces.
Figure 2:
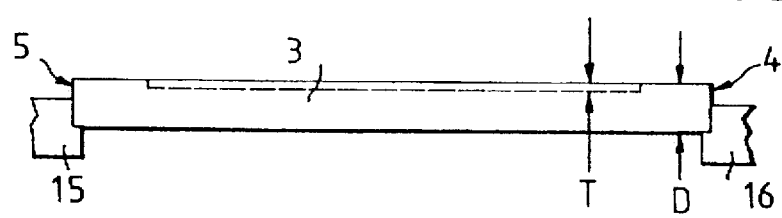
FIG. 2 is a side view of the boat of FIG. 1.

In the case of conventional boats, a temperature gradient develops because the clamping jaws of the boat holders act as heat sinks, the hottest zone being in the middle of the boat. Experience has shown that twice as much aluminum per unit surface area evaporates in this zone, which is about 2–3 cm long (the total length of the depression being 9 cm), than from the rest of the surface of the cavity (surface of the depression).

A predetermined (maximum) temperature may not be exceeded it if desired to evaporate without spatters and thus to obtain a coating which is free of pinholes. This maximum temperature is defined by the temperature of the hot zone. The evaporation rate is calculated by taking the average over the entire surface of the depression. The goal of the invention is to reduce the temperature gradient, so that the size of the zone which can be brought to this (maximum) temperature can be increased, as a result of which a higher average evaporation rate free of spatters can be obtained.

In cases where the boat is clamped at the ends by jaws 15, 16, it is now possible to achieve this goal without great expense by providing openings or groups of holes 12 in trough-shaped parts 3, 8. The trays a vertical depth T, and the elongate part has a thickness of D about five times the vertical depth T.

To reduce the cooling of the ends, it is advisable for only about ⅔ of ends 4, 5; 9, 10 of the evaporator boat or its trough-shaped area 3, 8 to be clamped, i.e., the ends have a vertical thickness, and the clamping surface constitutes only about ⅔ of the thickness. As a result of the reduction in cross section, the boats are heated to a higher temperature in an area closer to the clamping point. In the middle section of the boat, the material to be evaporated is melted and evaporated without forming drops.

In the case of long boats, wire feed to adjacent zones is separated by an area of reduced cross section which is a hot zone. In this way, a much higher evaporation rate without spatters can be achieved than ever before. In the case of long boats, the previously familiar disadvantage of the nonuniformity of the evaporation rate as a result of different temperatures and different degrees of wetting over the length of the boat is eliminated.

The relationship of hot to colder zones in the boat can be adjusted by reducing the cross section in such a way that, for any desired rate, the wire can be melted uniformly without drop formation. The areas of reduced cross section experience higher ohmic heating and therefore facilitate evaporation. Further, a reduced cross section adjacent to the ends reduces the heat sink effect of the clamping jaws.

Figure 3:
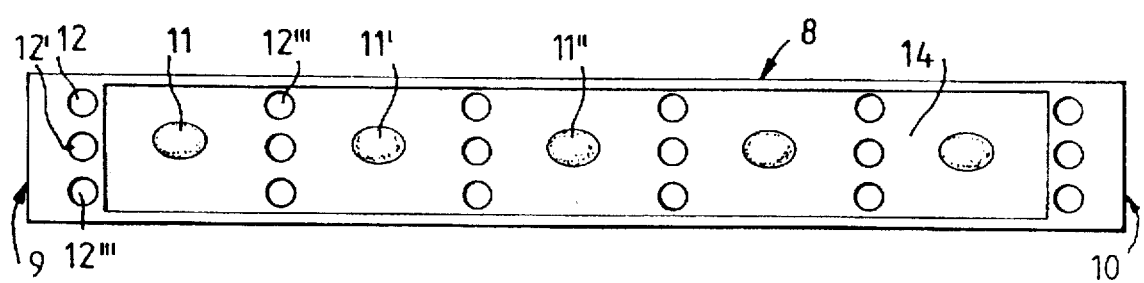
FIG. 3 is a top view of a boat with several evaporation zones.

The long boat shown in FIG. 3 has an especially long trough-shaped part 8 and is provided with a total of five melting zones 11, that is, the material to be melted or evaporated is supplied in the form of five pieces of wire to these five zones 11, where it forms in each case small "molten lakes", from which the material evaporates. These lakes or zones of molten material are indicated in the figure as ellipses.

Between the individual zones 11, 11', 11", there is in each case a group of three holes 12, 12', 12" which reduce the cross section of trough-shaped part 8 in proportion to their diameters.

Holes 12, are advisably perpendicular to the surface of the trough; but it is also quite possible for them to be horizontal and parallel to the plane of the trough.

We claim:

1. An evaporator boat for melting a material in a vacuum coating chamber, said boat comprising:
    an elongate part having diametrically opposed ends and said elongate part having a trough depression therein between said ends, said elongate part being heatable by passing a current therethrough,
    a clamping surface at each end for passing a current through said elongate part in order to evaporate material in at least two evaporation zones in said trough depression, and
    said elongate part having aperture means defining openings therein between said evaporation zones and between the evaporation zones and the ends of the part such that said elongate part has a reduced cross-section on either side of each of said evaporation zones relative to a cross-section thereof in said evaporation zones.

2. An evaporator boat as in claim 1 wherein said aperture means define a plurality of vertical holes through said part adjacent to each of said clamping surfaces.

3. An evaporator boat as in claim 1 wherein said aperture means define a plurality of vertical holes between adjacent evaporation zones in said trough.

4. An evaporator boat as in claim 1 wherein said part has a vertical thickness, and said clamping surface covers about two thirds of said vertical thickness at the ends of said part.

5. An evaporator boat as in claim 1 wherein said part has a vertical thickness and said trough depression has a vertical depth, said thickness being about five times said depth.

6. An evaporator boat for melting a material in a vacuum coating chamber, said boat comprising:
    a first end;
    a trough portion formed integral with the first end and extending therefrom;
    a second end formed integral with the trough portion distal to the first end;
    said first and second ends each having a respective clamping surface adapted to be clamped and through which an electrical current may be supplied so that current flows through said trough portion between said ends and causes said trough portion to heat;
    said ends each having a plurality of openings therein between the respective clamping surface and the trough portion located so that the ends have a reduced cross section relative to flow of the electrical current in the region of said openings;
    said trough portion having an upwardly disposed recess therein and at least two evaporation zones in said recess in which the material is melted; and
    said trough portion have a plurality of openings therein in said recess between the evaporation zones that provide in said trough portion between said evaporation zones a reduced cross-section to said current flowing through the trough portion between said evaporation zones so that temperatures in said evaporation zones are equalized.

7. An evaporation boat as in claim 6 wherein there are at least three evaporation zones in said trough portion, and said trough portion has openings therein reducing the cross section thereof between each of the evaporation zones and the adjacent zones.

8. An evaporation boat as in claim 6 wherein said trough portion has at least three openings therewith between adjacent evaporation zones.

9. The evaporation boat as in claim 6 wherein said trough portion has five evaporation zones in said recess, and said trough portion has a plurality of openings therein between all adjacent evaporation zones.

* * * * *

UNITED STATES PATENT AND TRADEMARK OFFICE
CERTIFICATE OF CORRECTION

PATENT NO. : 5, 788, 769
DATED : Aug. 4, 1998
INVENTOR(S) : Achtner et al.

It is certified that error appears in the above-identified patent and that said Letters Patent is hereby corrected as shown below:

Claim 6, column 4, line 25, delete "adapted".

Signed and Sealed this

Twentieth Day of June, 2000

Attest:

Q. TODD DICKINSON

*Attesting Officer*  *Director of Patents and Trademarks*